United States Patent [19]
Popescu

[11] Patent Number: 5,432,480
[45] Date of Patent: Jul. 11, 1995

[54] PHASE ALIGNMENT METHODS AND APPARATUS

[75] Inventor: Petre Popescu, Kanata, Canada

[73] Assignee: Northern Telecom Limited, Montreal, Canada

[21] Appl. No.: 43,690

[22] Filed: Apr. 8, 1993

[51] Int. Cl.[6] .................... H03K 5/135; H03L 7/087
[52] U.S. Cl. ........................................ 331/11; 331/27; 327/156; 327/236
[58] Field of Search .................. 328/155; 307/262; 331/10, 11, 27

[56] References Cited

U.S. PATENT DOCUMENTS

| | | | |
|---|---|---|---|
| 3,495,184 | 2/1970 | Perkins, Jr. et al. | 331/10 |
| 4,605,908 | 8/1986 | Broughton | 331/11 |
| 5,068,628 | 11/1991 | Ghoshal | 331/1 A |
| 5,235,290 | 8/1993 | Bar-David | 331/11 |

FOREIGN PATENT DOCUMENTS

| | | |
|---|---|---|
| 0500473A1 | 8/1992 | European Pat. Off. . |
| 0519892A2 | 12/1992 | European Pat. Off. . |
| 59-171233 | 9/1984 | Japan . |
| 2091961 | 8/1982 | United Kingdom ........ 328/155 |

OTHER PUBLICATIONS

Patent Abstracts of Japan: Patent No. A56051128 issued on May 8, 1981. Inventor: Yokoya Satoshi. Patentee: Sony Corp.

"Frequency Comparator Performs Double Duty", R. C. E. Thomas, Electrical Design News, vol. 15, No. 21, Nov. 1, 1990, pp. 29–32.

*Primary Examiner*—Andrew M. Dolinar
*Attorney, Agent, or Firm*—C. W. Junkin

[57] ABSTRACT

In methods and apparatus for controlling a phase relationship of two signals, a supplementary phase adjustment signal is generated. The supplementary phase adjustment signal has a zero value when an actual phase relationship of the two signals deviates from a desired phase relationship by less than a threshold phase deviation, and has a non-zero value when the actual phase relationship deviates from the desired phase relationship by more than the threshold phase deviation. The phase relationship of the two signals is adjusted in response to a sum of the supplementary phase adjustment signal and a phase adjustment signal which is proportional to the deviation of the actual phase relationship from the desired phase relationship. The methods and apparatus are particularly applicable to alignment of clock signals with data signals.

15 Claims, 11 Drawing Sheets

PHASE ALIGNMENT METHODS AND APPARATUS

FIELD OF THE INVENTION

This invention relates to methods and apparatus for phase alignment of digital signals. Such methods and apparatus are useful for clock recovery and data retiming in digital communications systems.

BACKGROUND OF THE INVENTION

In digital communications systems, local clock signals must be phase aligned with incoming data signals so that the incoming data can be correctly interpreted. In a conventional phase alignment method, a phase difference of an incoming data signal and a local clock signal is detected. If the local clock signal lags the incoming data signal by more than one half clock period, the phase of the local clock signal is advanced. If the local clock signal lags the incoming data signal by less than one half clock period, the phase of the local clock signal is retarded. Ideally, the phase of the local clock signal is maintained approximately one half clock period behind the phase of the incoming data signal so that a timing edge of the local clock signal is kept near the center of the "data eye".

In the conventional phase alignment method, the phase of the local clock signal must be adjusted rapidly enough to keep the timing edge within the "data eye". If the timing edge reaches the edge of the "data eye" (i.e. if the timing edge is allowed to pass a data edge) a bit of the incoming data stream will either be lost or detected twice. The rate at which the local clock phase is adjusted must be high enough to prevent such errors. Unfortunately, a high rate of adjustment for the phase of the local clock signal increases phase noise in the local clock signal.

SUMMARY OF THE INVENTION

This invention provides novel methods and apparatus for controlling phase relationships of signals. The novel methods and apparatus are intended to reduce or overcome problems with conventional phase alignment methods and apparatus as described above.

One aspect of the invention provides a method for controlling a phase relationship of two signals. The method comprises determining an actual phase relationship of the two signals and generating a phase adjustment signal indicative of any deviation of the actual phase relationship from a desired phase relationship. The method also comprises generating a supplementary phase adjustment signal having a zero value when the actual phase relationship deviates from the desired phase relationship by less than a threshold phase deviation and a non-zero value when the actual phase relationship deviates from the desired phase relationship by more than the threshold phase deviation. The method further comprises adjusting the phase relationship of the two signals in response to a sum of the phase adjustment signal and the supplementary phase adjustment signal.

The supplementary phase adjustment signal speeds up the correction of any deviation from the desired phase relationship only when the deviation exceeds the threshold phase deviation. Consequently, when applied to the phase alignment of a clock signal and a data signal, the rate of phase adjustment can be made small enough for deviations less than the threshold phase deviation to avoid excessive phase noise, and large enough for deviations greater than the threshold phase deviation to reduce data interpretation errors.

The phase adjustment signal may be proportional to the deviation of the actual phase relationship from the desired phase relationship, and the non-zero value of the supplementary phase adjustment signal may have a single fixed magnitude and a sign dependent on a sign of the deviation of the actual phase relationship from the desired phase relationship.

The method may include generation of an advanced signal which leads a first of the two signals by less than one half period and generation of a delayed signal which lags the first of the two signals by less than one half period. Phase relationships of the advanced signal and a second of the two signals and of the delayed signal and the second signal may be determined, and the supplementary phase adjustment signal may be generated in response to those phase relationships.

More particularly, one embodiment of the invention provides a method for phase alignment of a clock signal to a data signal. The method comprises generating an advanced clock signal which leads the clock signal by less than one half clock period and generating a delayed clock signal which lags the clock signal by less than one half clock period. The method further comprises determining an actual phase difference of the clock signal and the data signal and generating a phase adjustment signal indicative of any deviation of the actual phase difference from one half clock period, and generating a supplementary phase adjustment signal having a first non-zero value when the advanced clock leads the data signal, a second non-zero value when the delayed clock lags the data signal by more than one full clock period, and a zero value when the advanced clock signal lags the data signal and the delayed clock signal lags the data signal by less than one full clock period. The method further comprises adjusting the phase relationship of the clock signal to the data signal in response to a sum of the phase adjustment signal and the supplementary phase adjustment signal.

The first and second non-zero values of the supplementary phase adjustment signal may be equal in magnitude and opposite in sign.

Another aspect of the invention provides apparatus for controlling a phase relationship of two signals. The apparatus comprises a phase detector, a summer and a signal source. The phase detector determines an actual phase relationship of the two signals and generates a phase adjustment signal indicative of any deviation of the actual phase relationship from a desired phase relationship. The phase detector also generates a supplementary phase adjustment signal which has a zero value when the actual phase relationship deviates from the desired phase relationship by less than a threshold phase deviation and which has a non-zero value when the actual phase relationship deviates from the desired phase relationship by more than the threshold phase deviation. The summer sums the phase adjustment signal and the supplementary phase adjustment signal, and the signal source provides one of the two signals. The signal source is responsive to the sum of the phase adjustment signal and the supplementary phase adjustment signal to adjust the phase of one of the two signals relative to the other of the two signals.

The signal source may comprise a clock source which provides a clock signal for phase alignment with a data signal. The signal source may further comprise two delay elements connected in series to an output terminal of the clock source so that an advanced clock signal is available at the output terminal of the clock source, the clock signal is available at an output terminal of a first of the series connected delay elements, and a delayed clock signal is available at an output terminal of the second delay element.

The delays provided by the delay elements may be fixed, or may be variable delays which are responsive to he supplementary phase adjustment signal.

The clock source may be a voltage controlled oscillator or a clock extraction circuit for extraction of a clock signal from the data signal.

The phase detector may comprise first and second phase detection circuits. The first phase detection circuit may determine an actual phase difference of the data signal and the clock signal and generate a phase adjustment signal proportional to any deviation of the actual phase difference from one half period of the clock signal. The second phase detection circuit may generate a supplementary phase adjustment signal having a first non-zero value when the advanced clock signal leads the data signal, a second non-zero value when the delayed clock lags the data signal, and a zero value when the advanced clock lags the data signal and the delayed clock leads the data signal.

BRIEF DESCRIPTION OF THE DRAWINGS

Embodiments of the invention are described below by way of example only. Reference is made to accompanying drawings, in which.

DETAILED DESCRIPTION OF EMBODIMENTS

Figure 1:
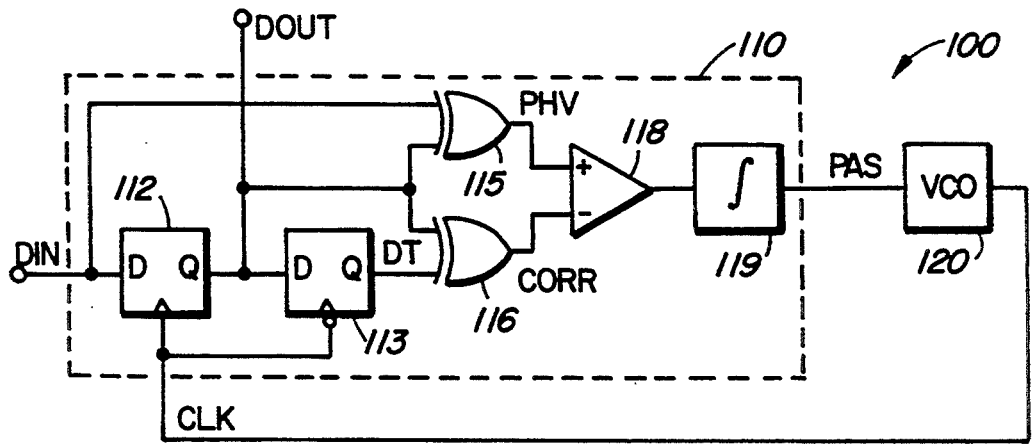
FIG. 1 is schematic diagram of a conventional phase lock loop (PLL) phase alignment circuit.

FIG. 1 is schematic diagram of a conventional phase alignment circuit 100. The phase alignment circuit 100 comprises a phase detector 110 and a signal source in the form of a voltage controlled oscillator (VCO) 120. The phase detector 110 and the VCO 120 are connected in a phase lock loop (PLL) configuration.

The phase detector 110 comprises first and second flip flops 112, 113, first and second exclusive-OR gates 115, 116, a difference amplifier 118 and an integrator 119. The first flip flop 112 retimes an input data signal DIN according to a clock signal CLK supplied by the VCO 120. The second flip flop retimes the retimed data signal DOUT according to an inversion of the clock signal CLK to generate a twice-retimed data signal DT. The first exclusive-OR gate 115 responds to the input data signal DIN and the retimed data signal DOUT to generate a pulse train PHV in which the pulse duration corresponds to a phase difference of the input data signal DIN and the retimed data signal DOUT. The second exclusive-OR gate 116 responds to the retimed data signal DOUT and the twice-retimed data signal DT to generate a pulse train CORR in which the pulse duration is one half period. The difference amplifier 118 generates a difference signal which is proportional to a difference between outputs of the first and second exclusive-OR gates 115, 116, and the integrator 119 integrates the difference signal to generate a phase adjustment signal PAS which is proportional to the deviation of the phase difference of the input data signal DIN and the retimed data signal DOUT from one half clock period.

Figure 2:
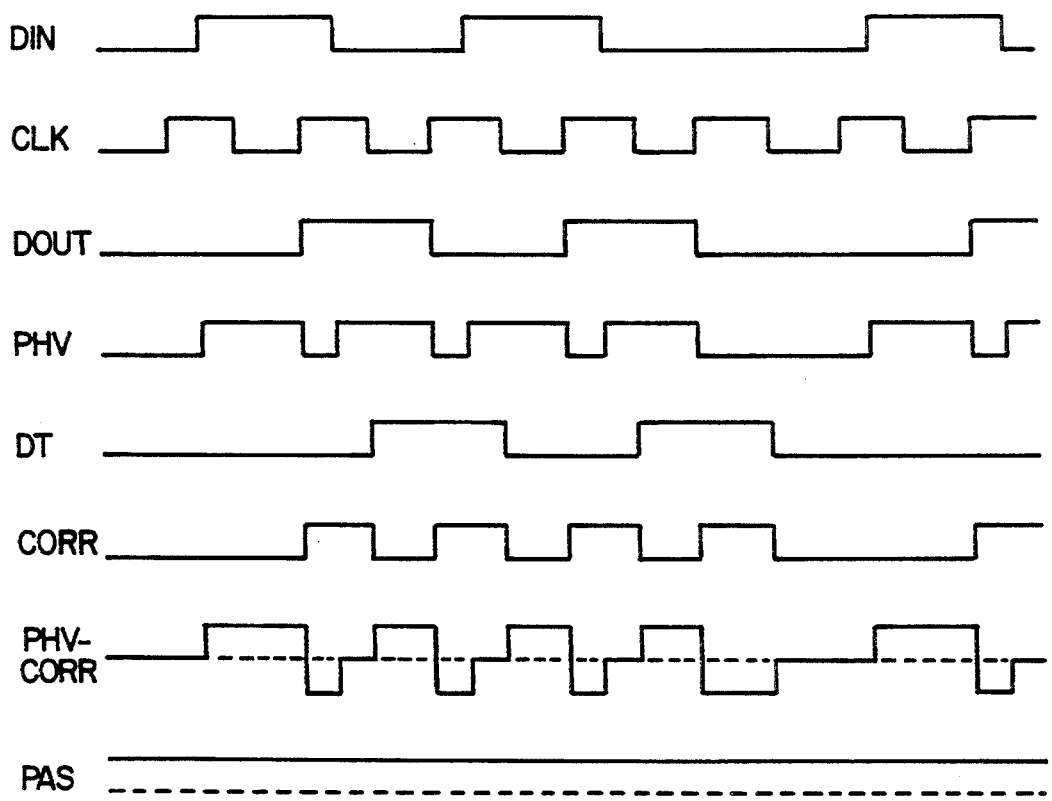
FIGS. 2 to 5 are timing diagrams illustrating operation of the phase alignment circuit of FIG. 1 under different conditions.

FIGS. 2 to 5 are timing diagrams illustrating operation of the phase alignment circuit 100 under different conditions. FIG. 2 illustrates operation of the circuit 100 with the input data signal DIN leading the clock signal CLK by more than one half clock period. The pulse train PHV generated by the first exclusive-OR gate 115 has pulses of duration longer than one half clock period, so the phase adjustment signal PAS is positive. The VCO 120 operates such that the positive phase adjustment signal PAS increases the frequency of the clock signal CLK to advance its phase and to thereby reduce the amount by which the input data signal DIN leads the clock signal CLK.

Figure 3:
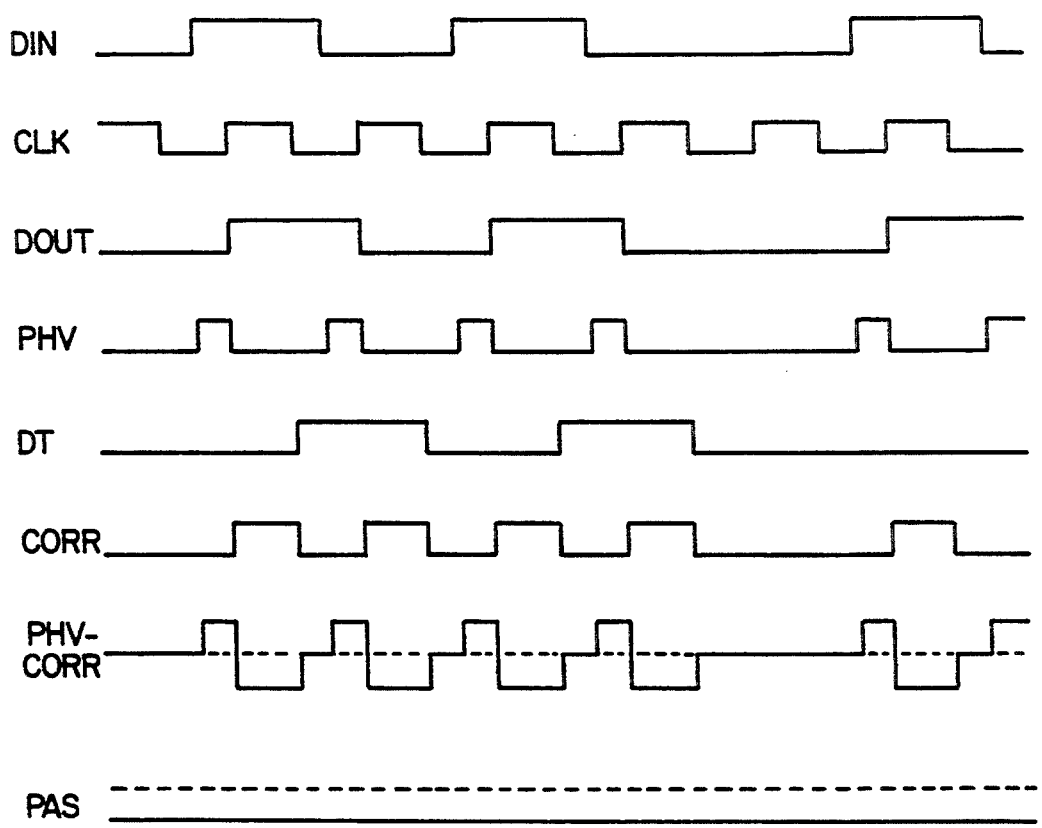

FIG. 3 illustrates operation of the circuit 100 with the input data signal DIN leading the clock signal CLK by less than one half clock period. The pulse train PHV generated by the first exclusive-OR gate 115 has pulses of duration shorter than one half clock period, so the phase adjustment signal PAS is negative. The VCO 120 operates such that the negative phase adjustment signal PAS decreases the frequency of the clock signal CLK to retard its phase and to thereby increase the amount by which the input data signal DIN leads the clock signal CLK.

Figure 4:
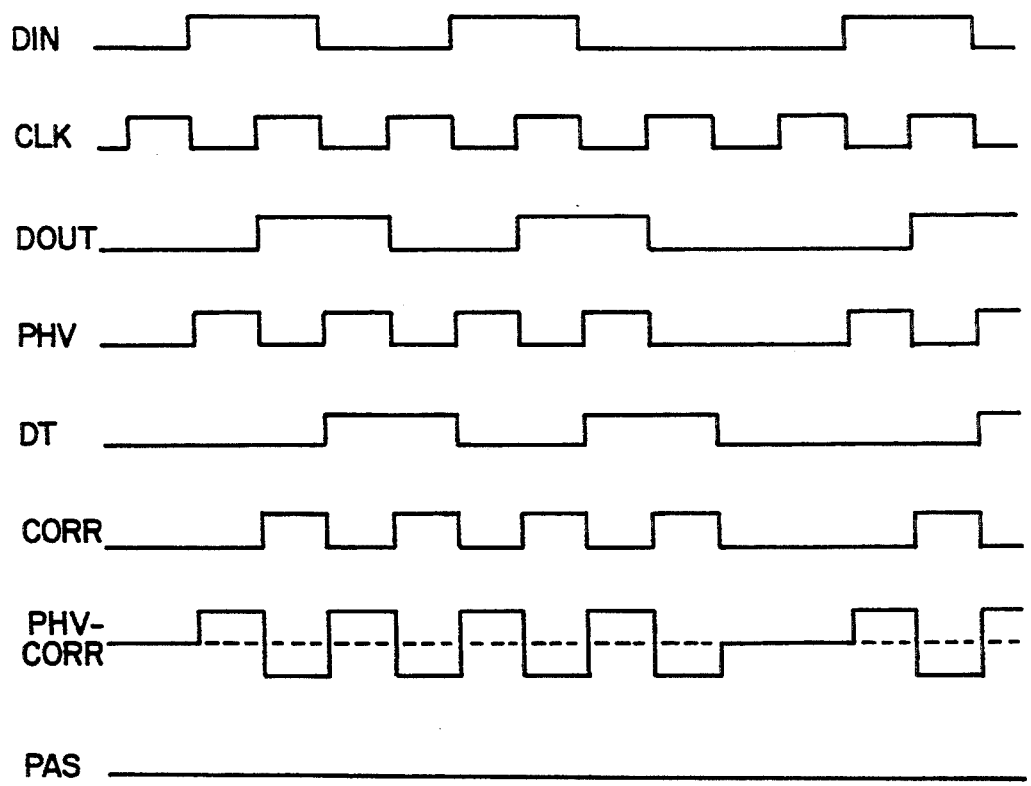

FIG. 4 illustrates operation of the circuit 100 at the desired operating point, i.e. with the input data signal DIN leading the clock signal CLK by exactly one half clock period as desired. The pulse train PHV generated by the first exclusive-OR gate 115 has pulses of one half clock period duration, so the phase adjustment signal PAS is zero, and the frequency of the clock signal CLK is not adjusted.

Figure 5:
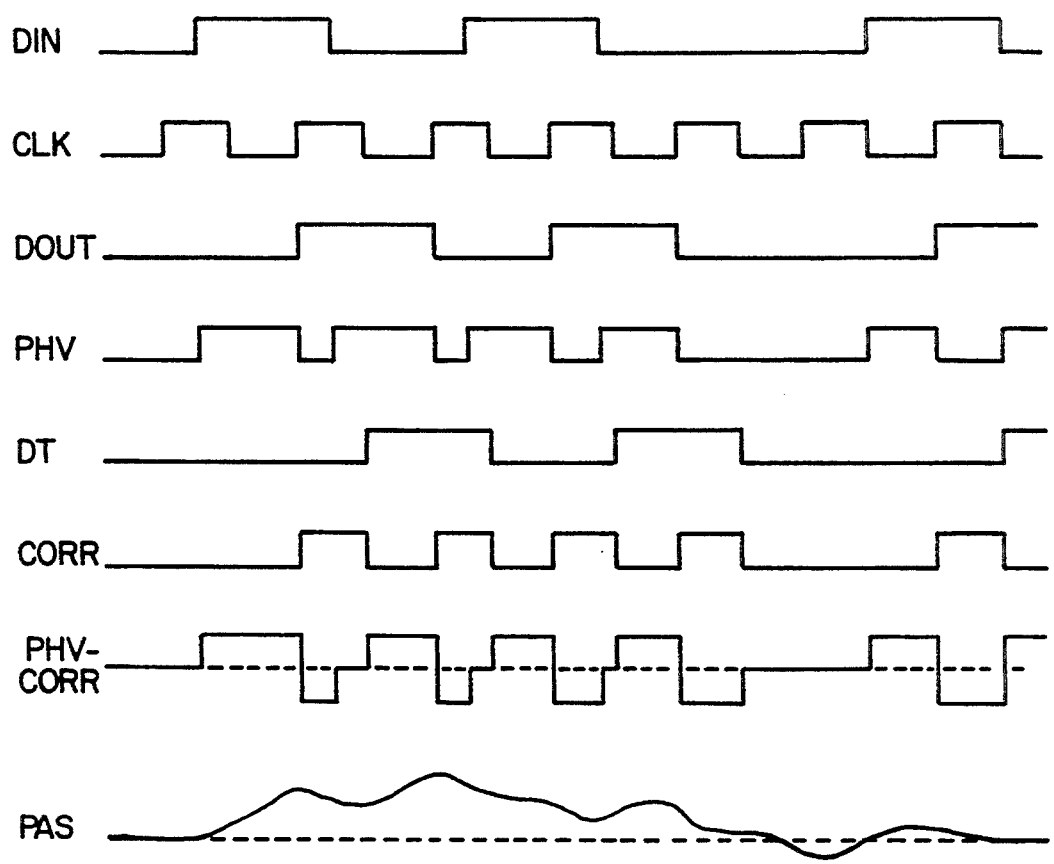

FIGS. 2 to 4 are drawn assuming that the integrator 119 integrates the signal provided by the difference amplifier 118 over a relatively long time period. This assumption makes the timing diagrams of FIGS. 2 to 4 easy to follow, but is somewhat unrealistic for actual operation of the circuit. FIG. 5 corresponds to FIG. 2 redrawn for a shorter and more realistic integration period. The timing diagrams of FIGS. 7 to 9 and FIG. 11 are also drawn assuming unrealistically long integration periods for ease of illustration.

Figure 6:
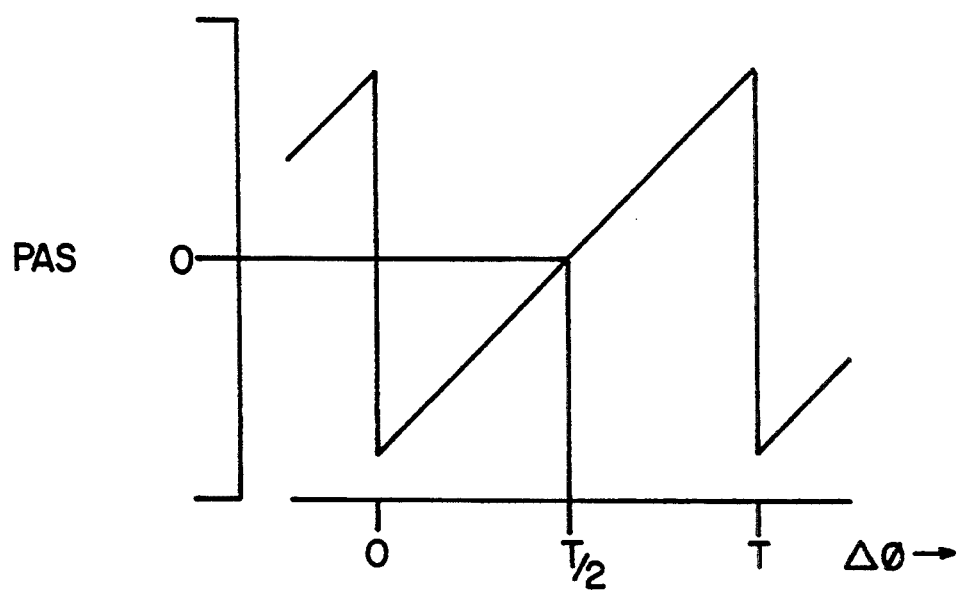
FIG. 6 is a plot showing a transfer characteristic of a phase detector of the circuit of FIG. 1.

FIG. 6 is a plot showing a transfer characteristic of the phase detector 110 of the phase alignment circuit 100. The transfer characteristic is piecewise linear with discontinuities at even multiples of one half clock period and zeroes at odd multiples of one half clock period.

Figure 7:
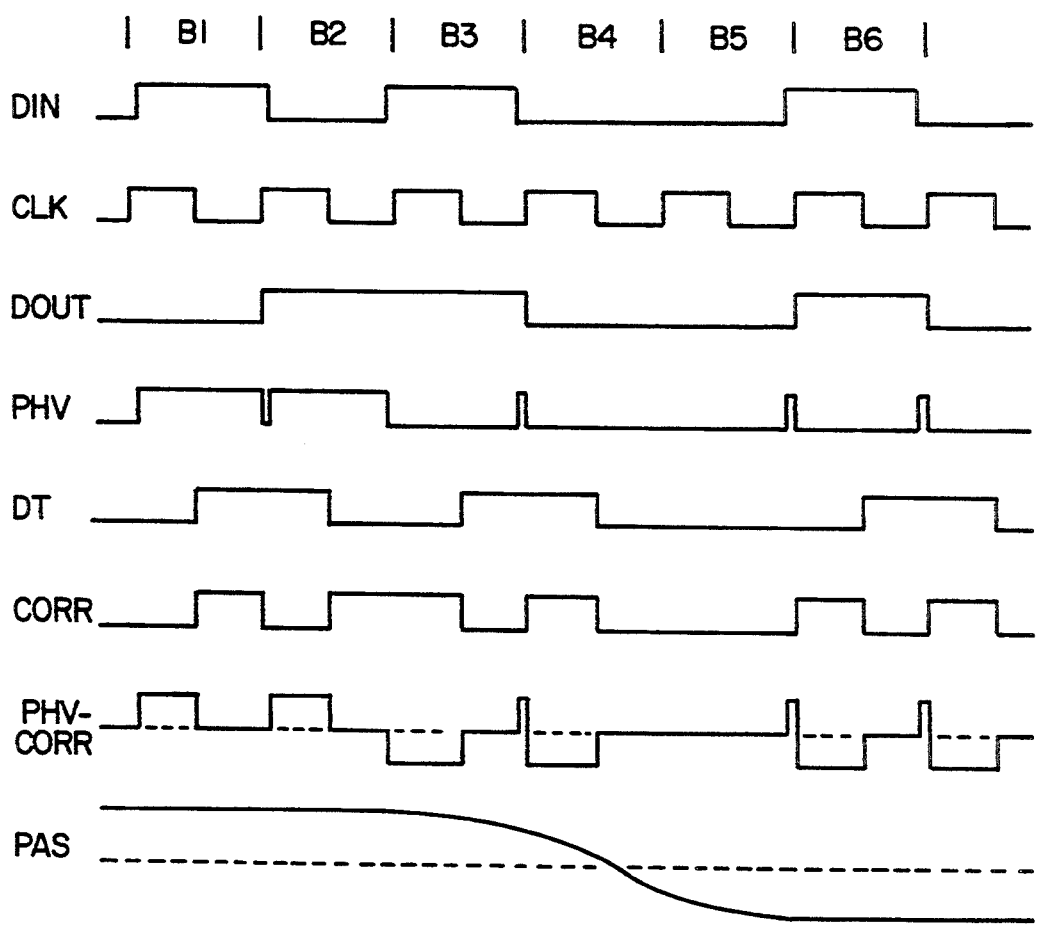
FIG. 7 is a timing diagram illustrating operation of the phase alignment circuit of FIG. 1 under another operating condition.

FIG. 7 is a timing diagram illustrating one effect of the discontinuities in the transfer characteristic shown in FIG. 5. During bit interval B1, the input data signal DIN leads the clock signal CLK by almost a full clock period. During bit interval B2, the input data signal DIN drifts faster than the VCO 120 can increase the clock frequency so that the input data signal DIN leads the clock signal CLK by more than one full clock period during bit intervals B3–B6. The bit of the input data signal DIN corresponding to bit interval B2 is lost from the retimed data signal DOUT, and the VCO 120 now decreases the clock frequency until the data signal DIN leads the clock signal by three half periods of the clock signal CLK.

Conversely, if the input data signal DIN drifts faster than the VCO 120 can decrease the clock frequency in its efforts to phase align the clock signal CLK to the input data signal DIN, a bit of the input data signal DIN is repeated in the retimed data signal DOUT, and the VCO 120 then increases the clock frequency until the data signal DIN lags the clock signal by one half period of the clock signal CLK.

The susceptibility of the phase alignment circuit 100 to repeating or losing bits of the input data signal DIN can be reduced by increasing the speed at which the VCO 120 adjusts the clock frequency, i.e. by increasing the slope of the linear portions of the transfer characteristic (which is usually called the phase detector gain, $K_d$). Unfortunately, this increases the phase noise generated when the phase alignment circuit 100 operates near its desired operating point. Hence there is a tradeoff between phase noise and susceptibility to bit errors in the operation of the phase alignment circuit 100.

Figure 8:
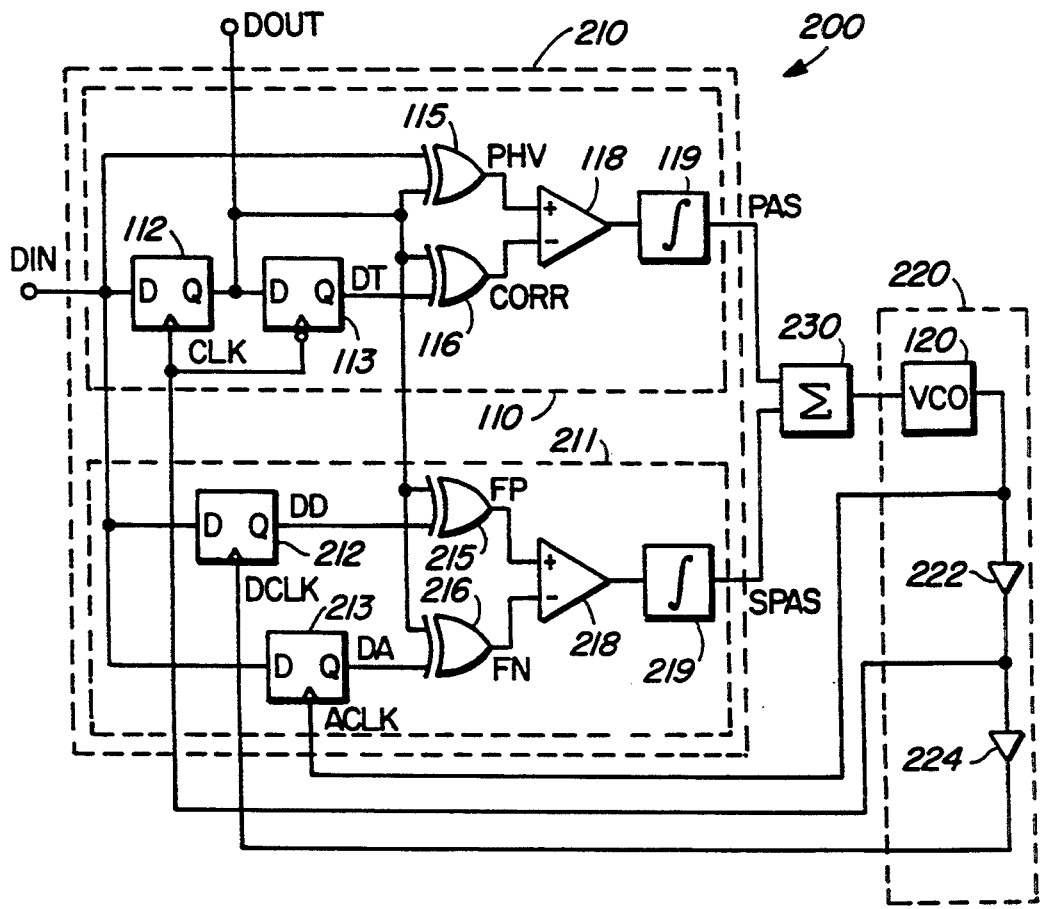
FIG. 8 is a schematic diagram of a phase alignment circuit according to an embodiment of the invention.

FIG. 8 is a schematic diagram of a phase alignment circuit 200 according to an embodiment of the invention. Like the conventional phase alignment circuit 100, the phase alignment circuit 200 comprises a phase detector 210 and a signal source 220 connected in a phase lock loop configuration. However, the phase detector 210 includes additional circuitry absent from the phase detector 110 of the conventional phase alignment circuit 100, and the signal source 220 includes delay elements 222, 224 in addition to a VCO 120 for generation of advanced and delayed clock signals ACLK, DCLK in addition to the clock signal CLK. The phase alignment circuit 200 also includes a summer 230.

The phase detector 210 comprises a first phase detection circuit 110 and a second phase detection circuit 211. The first phase detection circuit 110 is identical to the phase detector 110 of the conventional phase alignment circuit and its elements are therefore assigned the same reference numerals. The second phase detection circuit 211 comprises third and fourth flip flops 212, 213, third and fourth exclusive-OR gates 215, 216, a second difference amplifier 218 and a second integrator 219.

The third flip flop 212 retimes the input data signal DIN according to the delayed clock signal DCLK to generate a delayed retimed data signal DD. The fourth flip flop 213 retimes the input data signal DIN according to the advanced clock signal ACLK to generate an advanced retimed data signal DA. The third exclusive-OR gate 215 responds to the retimed data signal DOUT and the delayed retimed data signal DD to generate a pulse train FP. The fourth exclusive-OR gate 216 responds to the retimed data signal DOUT and the advanced retimed data signal DA to generate a pulse train FN. The second difference amplifier 218 amplifies the difference between the pulse trains FP, FN, and the second integrator 219 integrates the result to generate a supplementary phase adjustment signal SPAS. The summer 230 sums the phase adjustment signal PAS and the supplementary phase adjustment signal SPAS for application to the VCO 120.

Figure 9:
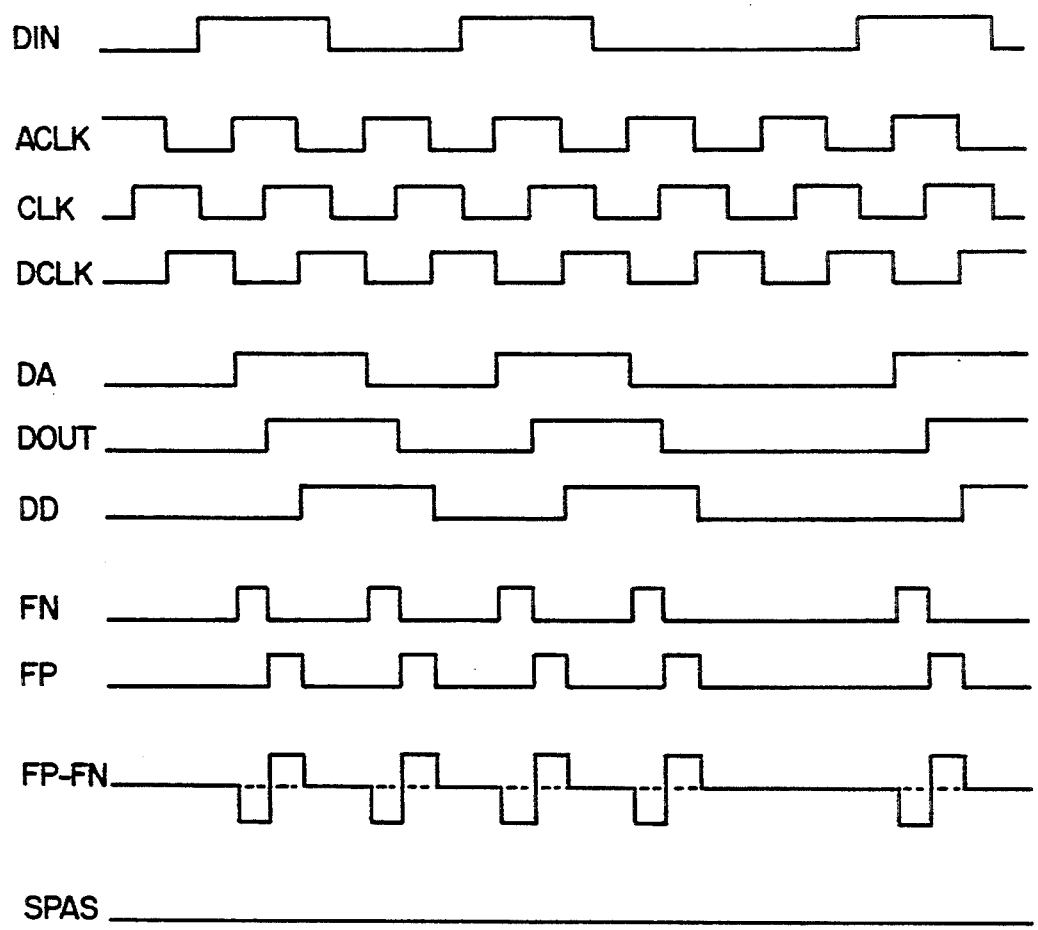
FIGS. 9 to 11 are timing diagrams illustrating operation of the phase alignment circuit of FIG. 8.
Figure 10:
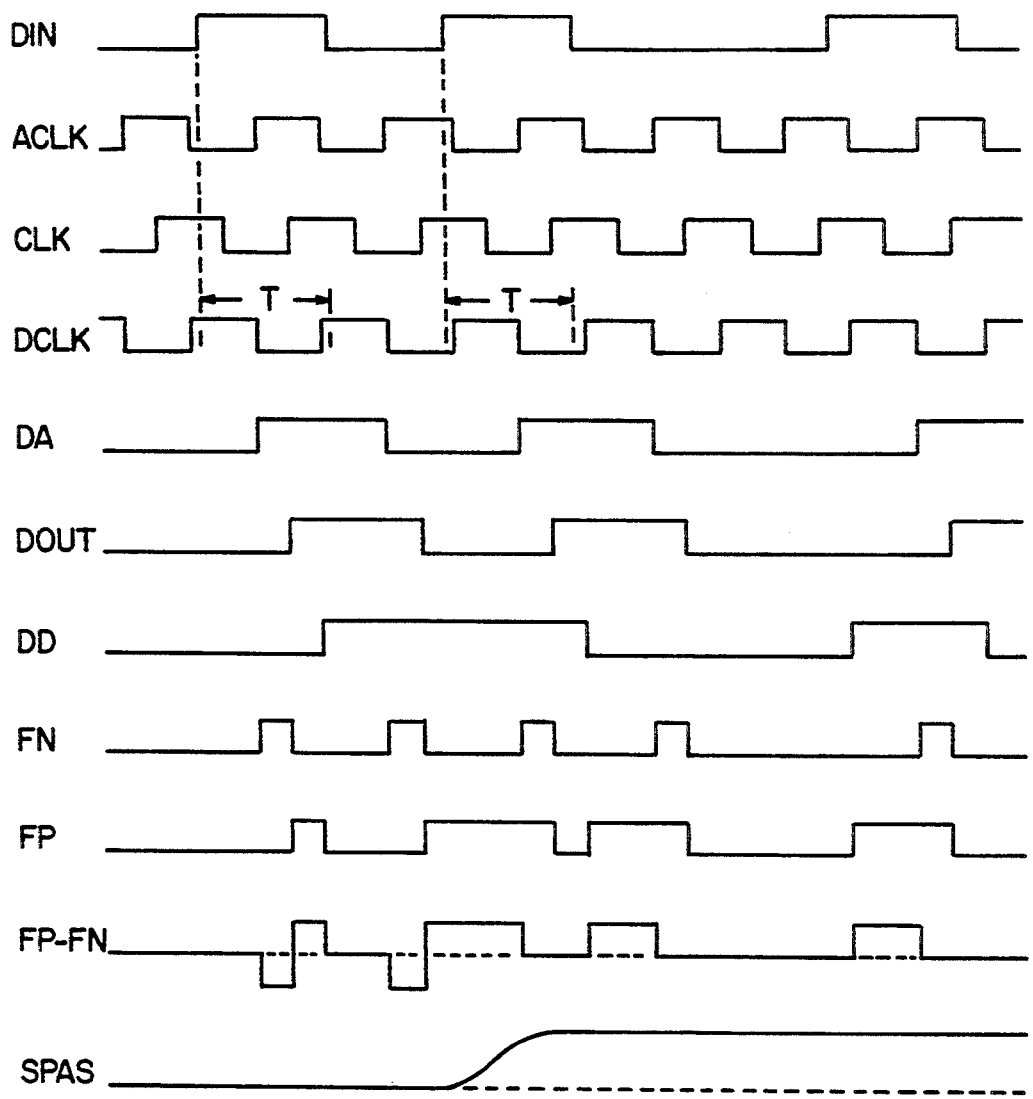
Figure 11:
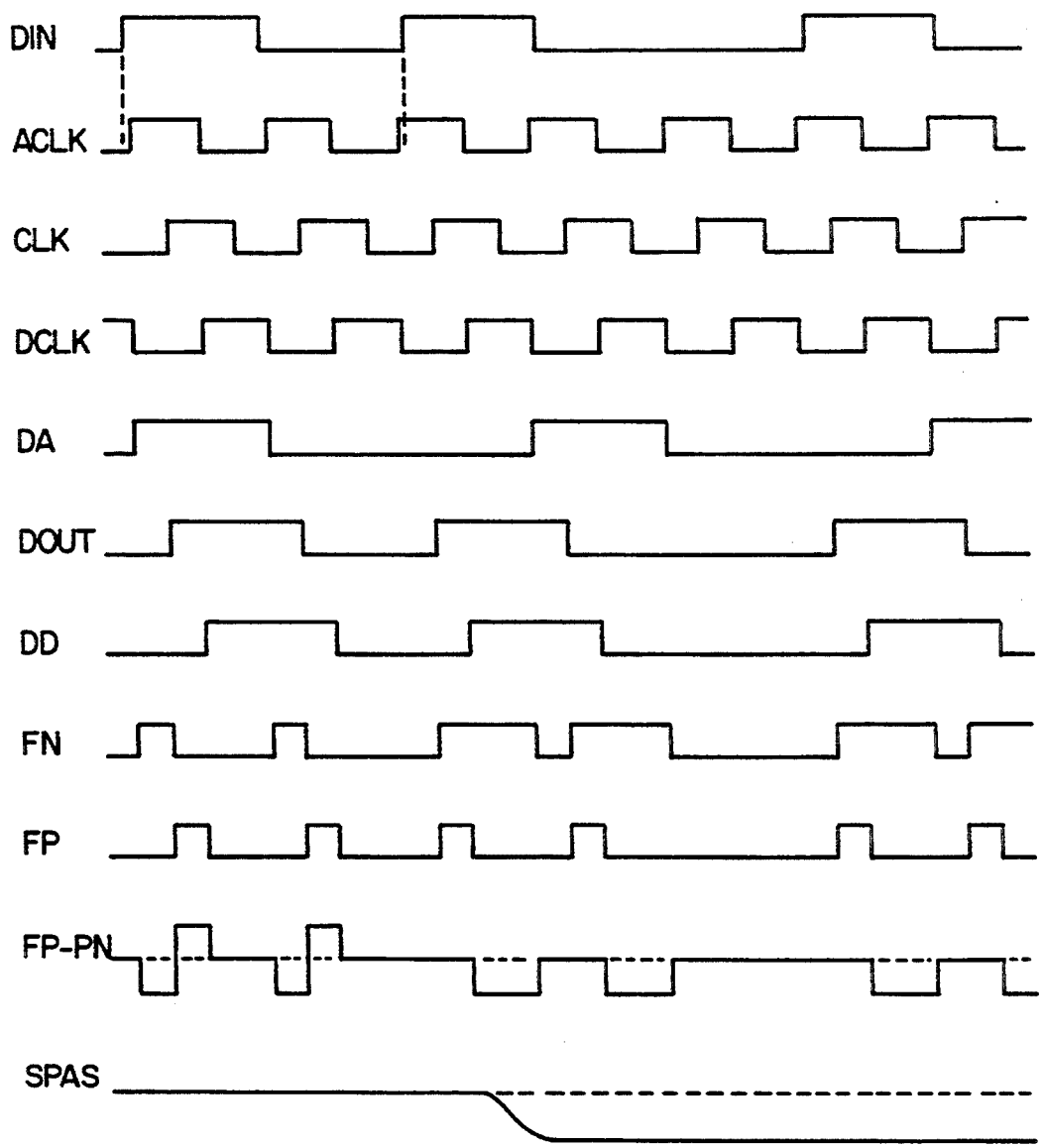

FIGS. 9 to 11 are timing diagrams illustrating operation of the phase alignment circuit 200. FIG. 8 illustrates operation of the circuit 200 with the input data signal DIN leading the advanced clock signal ACLK by less than one half clock period and the delayed clock signal DCLK by less than one full clock period. Under these conditions, the pulse trains FN, FP have pulses of duration corresponding to the delays provided by the delay elements 222, 224 respectively. Provided that these delays are substantially the same, the pulse trains cancel out when subtracted by the second difference amplifier 218 and integrated by the second integrator 219, so the supplementary phase adjustment signal SPAS is substantially zero. Under these conditions, the phase alignment circuit 200 operates essentially the same as the conventional phase alignment circuit 100.

FIG. 10 illustrates operation of the circuit 200 when the input data signal DIN leads the delayed clock signal DCLK by more than one full clock period. In this case, the pulse train FP developed from the retimed data DOUT and the delayed retimed data DD has pulses of a duration corresponding to one full clock period minus the delay provided by one of the delay elements 224. Consequently, the pulse trains FP, FN do not cancel and a non-zero supplementary phase adjustment signal SPAS is provided to accelerate correction of the clock frequency and phase.

FIG. 11 illustrates operation of the circuit 200 when the input data signal DIN lags the advanced clock signal ACLK. In this case, the pulse train FN developed from the retimed data DOUT and the advanced retimed data DA has pulses of a duration corresponding to one full clock period minus the delay provided by the other of the delay elements 222. Again, the pulse trains FP, FN do not cancel and a non-zero supplementary phase adjustment signal SPAS is provided to accelerate correction of the clock frequency and phase.

Figure 12:
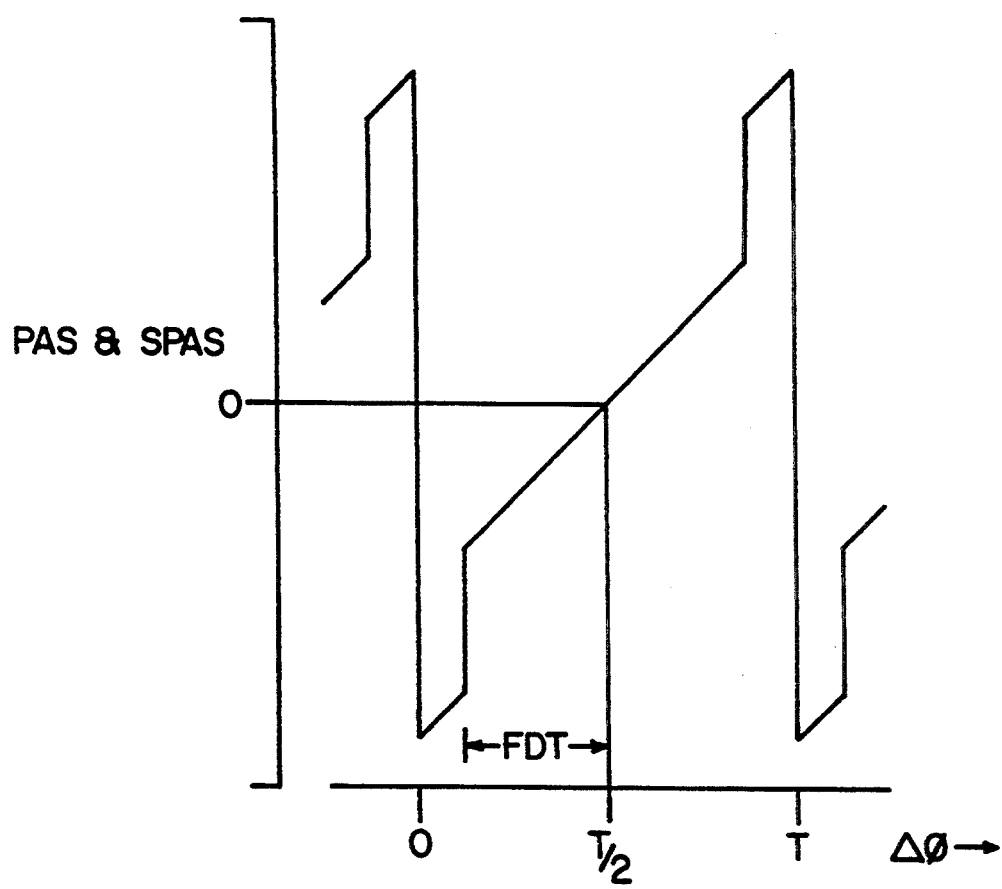
FIG. 12 is a plot showing a transfer characteristic of a phase detector of the circuit of FIG. 8.

FIG. 12 is a plot showing a transfer characteristic of the phase detector 210. The transfer characteristic for the phase detector 210 is similar to the transfer characteristic for the conventional phase detector 110, except for step discontinuities displaced from odd multiples of one half clock period by a phase deviation threshold PDT. The step discontinuities correspond to the non-zero values of the supplementary phase adjustment signal SPAS, are equal in magnitude, and have a sign which depends on the sign of the deviation of the actual phase relationship of the input data signal DIN and the clock signal CLK. These step discontinuities cause acceleration of the clock phase and frequency correction for large deviations of the phase relationship of the input data signal DIN and the clock signal CLK from the desired one half clock period phase difference, thereby reducing the probability of repeated or lost bits in the retimed data signal DOUT. Because the accelerated correction does not operate for small deviations of the actual phase relationship from the desired phase relationship, undue phase noise is avoided.

Thus, the phase alignment circuit 200 is able to capture and hold phase alignment for signals that have larger deviations in phase and frequency than can the conventional phase alignment circuit 100. Moreover, because the combined gain of the first difference amplifier 118 and the first integrator 119 can be controlled separately from the combined gain of the second difference amplifier 218 and the second integrator 219, and the time constants of the first integrator 119 can be controlled separately from the time constants of the second integrator 219, the tradeoff between the probability of bit errors and susceptibility to phase noise can be managed effectively by appropriate specification of these parameters.

while use of two separate integrators 119, 219 advantageously permits selection of different integration time constants for optimization of the tradeoff between the probability of bit errors and susceptibility to phase noise, this level of control is not required for all applications. In some applications, the two integrators 119, 219 can be replaced by a single integrator located between the summer 230 and the signal source 220 shown in FIG. 8.

The phase deviation threshold PDT can also be adjusted by appropriate specification of the delay elements 222, 224 to provide further control of this tradeoff. Indeed, the delay elements 222, 224 can be variable delay elements which are responsive to the supplementary phase adjustment signal components FP and FN so that the clock edge is centered in the data eye and the data eye is opened as wide as possible. This is particularly important if the data signal slopes for "0" to "1" transitions differ from the data signal slopes for "1" to "0" transitions, or if the data signal is corrupted by noise.

Integration of the components FP and FN of the supplementary phase adjustment signal SPAS over a suitably long time period, automatically compensates for any DC offsets resulting from voltage offsets in the phase detector amplifiers 118, 218 and integrators 119, 219.

Figure 13:
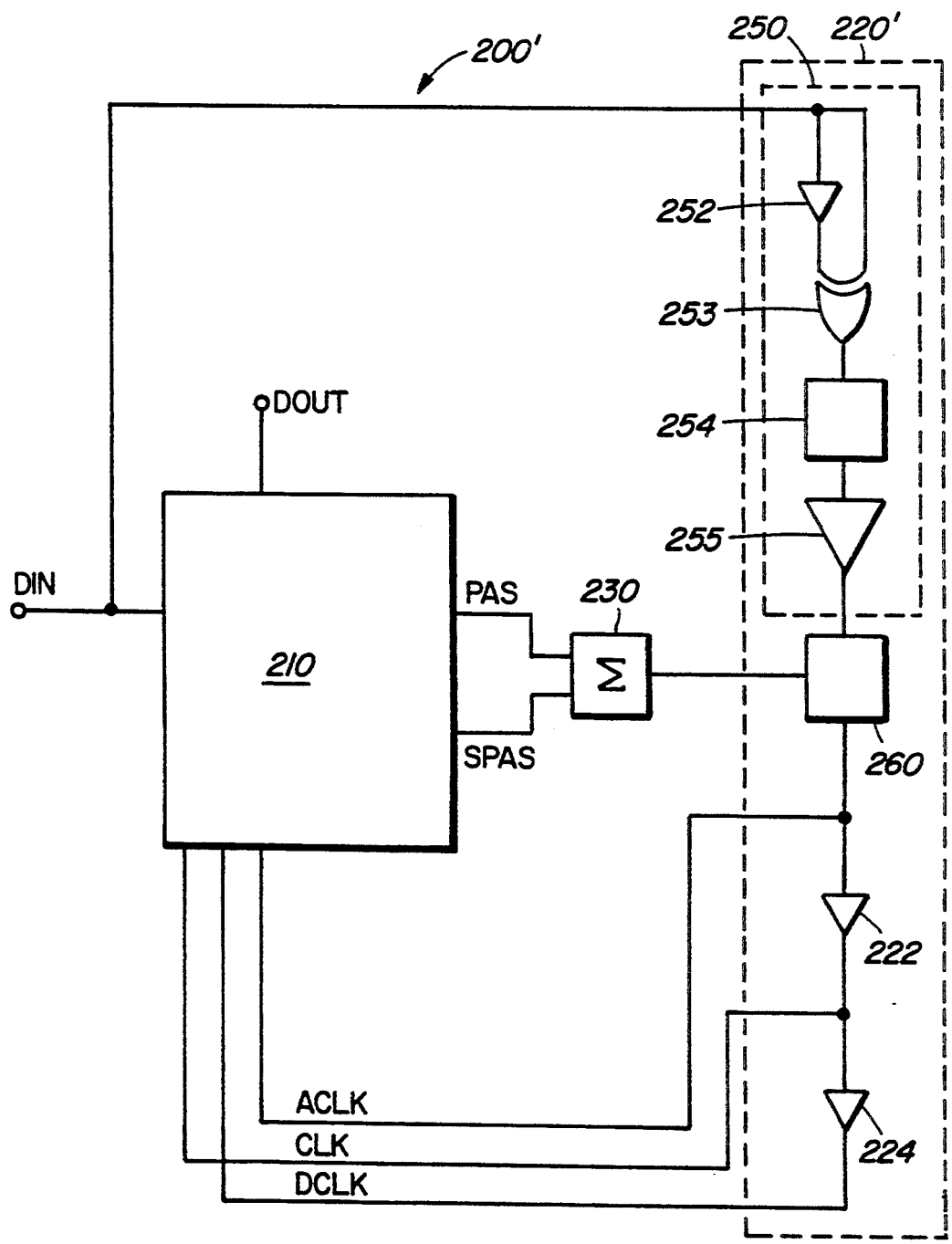
FIG. 13 is a schematic diagram of a phase alignment circuit according to an alternative embodiment of the invention.

FIG. 13 is a circuit schematic diagram of a phase alignment circuit 200' according to an alternative embodiment. In the alternative phase alignment circuit 200, a clock extraction circuit 250 and a voltage controlled phase shifter 260 replace the VCO 120. The clock extraction circuit 250 comprises a delay element 252, an exclusive-OR gate 253, a high Q bandpass filter 254 and an amplifier 255. The delay element 252 delays the data signal DIN by approximately one half period of the data signal, and the exclusive-OR gate combines the delayed signal with the data signal DIN to produce a resulting signal having a component at the clock frequency. The high Q bandpass filter (typically a surface acoustic wave (SAW) device or a ceramic resonator) has a passband centered on the expected clock frequency so that it passes only the component of the resulting signal at the clock frequency. The amplifier 255 amplifies that component and applies it to the phase shifter 260 which is responsive to the output of the summer 230 to adjust the phase of the extracted clock signal. Otherwise, the phase alignment circuit 200' is similar to the previously described phase alignment circuit 200 and its operation is similar to the operation of the previously described phase alignment circuit 200. The phase alignment circuit 200' has a greater tolerance for phase deviations than conventional phase alignment circuits using clock extraction techniques.

While the embodiments described above concern the phase alignment of clock signal CLK to an input data signal DIN to a one half clock period phase deviation, the inventive concept can be generalized to control a phase relationship of any two signals around any desired phase deviation.

For example, two signals can be controlled so as to be phase aligned with substantially zero phase deviation. In this case, an advanced signal which leads a first of the two signals by less than one half period and a delayed signal which lags the first signal by less than one half period are generated. A phase adjustment signal proportional to any phase difference of the first and second signals is generated. A supplementary phase adjustment signal is also generated, the supplementary phase adjustment signal having a first non-zero value when the advanced signal lags the second signal, a second non-zero value when the delayed signal leads the second signal, and a zero value when the advanced signal leads the second signal and the delayed signal lags the second signal. Normally, the first and second non-zero values of the supplementary phase adjustment signal would be equal in magnitude and opposite in sign.

Moreover, other circuit implementations may be developed to perform the inventive methods for controlling phase relationships.

Such modifications and generalizations are within the scope of the invention as claimed below.

I claim:

1. A method for controlling a phase relationship of two signals, the method comprising:

determining an actual phase relationship of the two signals and generating a phase adjustment signal indicative of any deviation of the actual phase relationship from a desired phase relationship;

generating an advanced signal which leads a first of the two signals by less than one half period and a delayed signal which lags the first of the two signals by less than one half period;

determining a phase relationship of the advanced signal and the second of the two signals and a phase relationship of the delayed signal and the second signal, and generating a supplementary phase adjustment signal in response to said phase relationships, the supplementary phase adjustment signal having a value which is zero when the actual phase relationship deviates from the desired phase relationship by less than a threshold phase deviation and non-zero when the actual phase relationship deviates from the desired phase relationship by more than the threshold phase deviation; and adjusting the phase relationship of the two signals in response to a sum of the phase adjustment signal and the supplementary phase adjustment signal.

2. A method as defined in claim 1, comprising:

setting the supplementary phase adjustment signal to a first non-zero value when the advanced signal leads the second signal;

setting the supplementary phase adjustment signal to a second non-zero value when the delayed signal lags the second signal by more than one full clock period; and setting the supplementary phase adjustment signal to a zero value when the advanced signal lags the second signal and the delayed signal lags the second signal by less than one full clock period.

3. A method as defined in claim 2, wherein the first and second non-zero values of the supplementary phase adjustment signal are equal in magnitude and opposite in sign.

4. A method as defined in claim 1, comprising:

setting the supplementary phase adjustment signal to a first non-zero value when the advanced signal lags the second signal;

setting the supplementary phase adjustment signal to a second non-zero value when the delayed signal leads the second signal; and setting the supplementary phase adjustment signal to a zero value when the advanced signal leads the second signal and the delayed signal lags the second signal.

5. A method as defined in claim 7, wherein the first and second non-zero values of the supplementary phase adjustment signal are equal in magnitude and opposite in sign.

6. A method for phase alignment of a clock signal to a data signal, the method comprising:
generating an advanced clock signal which leads the clock signal by less than one half clock period;
generating a delayed clock signal which lags the clock signal by less than one half clock period;
determining an actual phase difference of the clock signal and the data signal and generating a phase adjustment signal indicative of any deviation of the actual phase difference from one half clock period;
generating a supplementary phase adjustment signal having a first non-zero value when the advanced clock signal leads the data signal, a second non-zero value when the delayed clock signal lags the data signal by more than one full clock period, and a zero value when the advanced clock signal lags the data signal and the delayed clock signal lags the data signal by less than one full clock period; and
adjusting the phase relationship of the clock signal to the data signal in response to a sum of the phase adjustment signal and the supplementary phase adjustment signal.

7. A method as defined in claim 6, wherein the first and second non-zero values of the supplementary phase adjustment signal are equal in magnitude and opposite in sign.

8. Apparatus for controlling a phase relationship of a clock signal and a data signal, the apparatus comprising:
a signal source comprising a clock source and two delay elements connected in series to an output terminal of the clock source, an advanced clock signal being available at the output terminal of the clock source, the clock signal being available at an output terminal of a first of the series connected delay elements, and a delayed clock signal being available at an output terminal of the second delay element, the signal source being responsive to a sum of a phase adjustment signal and a supplementary phase adjustment signal to adjust the phase relationship of the clock signal and the data signal;
a phase detector for determining phase relationships of the clock signal and the data signal, the advanced clock signal and the data signal and the delayed clock signal and the data signal, for generating the phase adjustment signal, the phase adjustment signal being indicative of any deviation of the phase relationship of the clock signal and the data signal from a desired phase relationship and for generating the supplementary phase adjustment signal response to the phase relationships of the data signal and the advanced and delayed clock signals, the supplementary phase adjustment signal having a zero value when the actual phase relationship deviates from the desired phase relationship by less than a threshold phase deviation and a non-zero value when the actual phase relationship deviates from the desired phase relationship by more than the threshold phase deviation; and
a summer for summing the phase adjustment signal and the supplementary phase adjustment signal.

9. Apparatus as defined in claim 8, wherein the clock source comprises a voltage controlled oscillator which is responsive to the sum of the phase adjustment signal and the supplementary phase adjustment signal to adjust the phase of the clock signal relative to the data signal.

10. Apparatus as defined in claim 8, wherein the clock source comprises a clock extraction circuit for extracting a clock signal from the data signal and a phase shifter responsive to the sum of the phase adjustment signal and the supplementary phase adjustment signal to adjust the phase of the clock signal relative to the data signal.

11. Apparatus as defined in claim 8, wherein the delay elements provide delays which are fixed and substantially equal.

12. Apparatus as defined in claim 8, wherein the delay elements provide variable delays which are responsive to the supplementary phase adjustment signal.

13. Apparatus as defined in claim 8, wherein the phase detector comprises:
a first phase detection circuit for determining an actual phase difference of the data signal and the clock signal and for generating a phase adjustment signal proportional to any deviation of the actual phase difference from one half period of the clock signal; and
a second phase detection circuit for generating a supplementary phase adjustment signal having a first non-zero value when the advanced clock signal leads the data signal, a second non-zero value when the delayed clock signal lags the data signal, and a zero value when the advanced clock signal lags the second signal and the delayed clock signal leads the data signal.

14. Apparatus as defined in claim 13, wherein:
the first phase detection circuit comprises:
a first flip flop for retiming the data signal according to the clock signal;
a second flip flop for retiming the retimed data signal according to an inverted clock signal to generate a twice-retimed data signal;
a first exclusive-OR gate responsive to the data signal and the retimed data signal;
a second exclusive-OR gate responsive to the retimed data signal and the twice-retimed signal;
a first difference amplifier for generating a first difference signal proportional to a difference between outputs of the first and second exclusive-OR gates; and
a first integrator for integrating the first difference signal to produce the phase adjustment signal; and
the second phase detection circuit comprises:
a third flip flop for retiming the data signal according to the delayed clock signal to generate a delayed retimed data signal;
a fourth flip flop for retiming the data signal according to the advance clock signal to generate an advanced retimed data signal;
a third exclusive-OR gate responsive to the retimed data signal and the delayed retimed data signal;
a fourth exclusive-OR gate responsive to the retimed data signal and the advanced retimed data signal;
a second difference amplifier for generating a second difference signal corresponding to a difference between outputs of the third and fourth exclusive-OR gates; and a second integrator for integrating the second difference signal to produce the supplementary phase adjustment signal.

15. Apparatus as defined in claim 14, wherein:

a combined gain of the first difference amplifier and the first integrator and a combined gain of the second difference amplifier and the second integrator are separately controllable; and time constants of the first integrator and time constants of the second integrator are separately controllable.

* * * * *